United States Patent [19]

McClure

[11] Patent Number: 5,455,802
[45] Date of Patent: Oct. 3, 1995

[54] DUAL DYNAMIC SENSE AMPLIFIERS FOR A MEMORY ARRAY

[75] Inventor: David C. McClure, Carrollton, Tex.

[73] Assignee: SGS-Thomson Microelectronics, Inc., Carrollton, Tex.

[21] Appl. No.: 995,581

[22] Filed: Dec. 22, 1992

[51] Int. Cl.$^6$ .................................................. G11C 11/34
[52] U.S. Cl. ................. 365/233; 365/207; 365/189.05; 365/190; 365/202; 326/51; 326/57
[58] Field of Search ........................... 365/233, 230.08, 365/189.01, 201, 207, 203, 208, 189.05, 189.07, 190, 196; 307/530, 355; 326/51, 57

[56] References Cited

U.S. PATENT DOCUMENTS

| | | | |
|---|---|---|---|
| 5,023,841 | 6/1991 | Akrout et al. | 365/189.01 |
| 5,220,527 | 6/1993 | Ohsawa | 365/207 |
| 5,291,452 | 1/1994 | Hotta | 365/207 |

FOREIGN PATENT DOCUMENTS

| | | |
|---|---|---|
| 0227128 | 7/1987 | European Pat. Off. . |
| 0301277 | 2/1989 | European Pat. Off. . |
| 0499460 | 8/1992 | European Pat. Off. . |

*Primary Examiner*—David C. Nelms
*Assistant Examiner*—Huan Hoang
*Attorney, Agent, or Firm*—Kenneth C. Hill; Lisa K. Jorgenson; Richard K. Robinson

[57] ABSTRACT

A method and circuit for reading a memory array by utilizing dual dynamic sense amplifiers. A first and a second dynamic sense amplifier are connected to an input line and complementary input line. A latch and a clocking circuit are also connected to the two dynamic sense amplifiers. Initially, an equilibrating signal is input into both sense amplifiers. A first clocking signal and a first isolating signal are then input into the first dynamic sense amplifier. The first clocking signal enables the first sense amplifier to read the data on the input and complementary input lines, while the first isolating signal isolates the first sense amplifier from the input and complementary input lines. An output is then provided to the latch based upon the data read by the first sense amplifier. A second clocking signal and a second isolating signal are then input into the second sense amplifier to enable the second sense amplifier to read the data on the input and complementary input lines. The state of the latch may or may not change based upon the data read by the second sense amplifier.

15 Claims, 2 Drawing Sheets

DUAL DYNAMIC SENSE AMPLIFIERS FOR A MEMORY ARRAY

BACKGROUND OF THE INVENTION

1. Field of the Invention:

The present invention relates in general to integrated circuits, and more particularly to memory arrays. Still more particularly, the present invention relates to dynamic sense amplifiers for memory arrays.

2. Description of the Prior Art:

Sense amplifiers are used to read the voltage levels in static random access memory (SRAM) and dynamic random access memory (DRAM) devices. Two types of sense amplifiers may be used to read the memory array, a static sense amplifier and a dynamic sense amplifier. Dynamic sense amplifiers offer various advantages over static sense amplifiers, examples being lower power consumption, more compact layout, and higher sensing speed.

A disadvantage to using typical dynamic sense amplifiers is the inability to "recover" the output of the sense amplifier. To "recover" a sense amplifier means to change the output of the sense amplifier if the initial data sensed was incorrect. If only one memory cell out of the SRAM memory array is read incorrectly and can not be recovered, the die is useless.

To reduce the chances of having a dynamic sense amplifier read a cell incorrectly, the dynamic sense amplifiers are not enabled, or "clocked", at an optimum time, but rather are clocked after a worst case time delay. A worst case time delay typically takes into account processing, sense amplifier offsets, and operating conditions such as temperature and voltage. Clocking a dynamic sense amplifier after a worst case time delay ensures that a sufficient signal has built up before sensing begins. Clocking the sense amplifier in this manner, however, has the undesirable effect of reducing the operation speed of some of the potentially faster SRAMs in the distribution of memory arrays in order to ensure the slower SRAMs within the distribution of memory arrays are fully functional.

Therefore, it would be desirable to provide a method and circuit for reading a memory array which can be recovered and which may operate at a faster rate of speed.

SUMMARY OF THE INVENTION

A method and circuit is provided for reading a memory array by utilizing dual dynamic sense amplifiers. A first and a second dynamic sense amplifier are connected to an input line and complementary input line. A latch and a clocking circuit are also connected to the two dynamic sense amplifiers. Initially, an equilibrating signal is input into both sense amplifiers. A first clocking signal and a first isolating signal are then input into the first dynamic sense amplifier. The first clocking signal enables the first sense amplifier to read the data on the input and complementary input lines, while the first isolating signal isolates the first sense amplifier from the input and complementary input lines. An output is then provided to the latch based upon the data read by the first sense amplifier. A second clocking signal and a second isolating signal are then input into the second sense amplifier to enable the second sense amplifier to read the data on the input and complementary input lines. The state of the latch may or may not change based upon the data read by the second sense amplifier.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
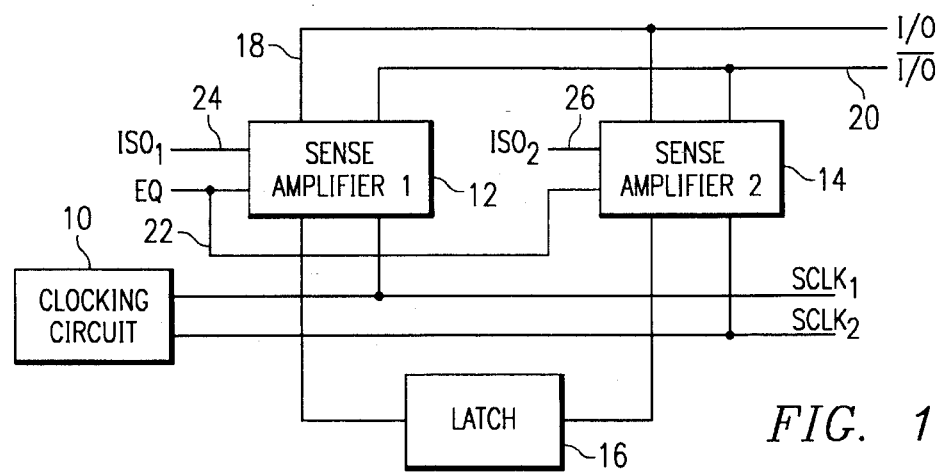
FIG. 1 is a high level block diagram illustrating a circuit according to the present invention.

Referring to FIG. 1, a high level block diagram illustrating a circuit according to the present invention is illustrated. A clocking circuit 10 is connected to a first dynamic sense amplifier 12 and a second dynamic sense amplifier 14, and a latch 16 is connected to sense amplifiers 12, 14. Any clocking circuit which can generate multiple clocking signals may be utilized as clocking circuit 10.

Signal lines 18, 20 labeled I/O and I/O bar, respectively, are connected to sense amplifiers 12, 14. I/O and I/O bar may be connected to sense amplifiers 12, 14 from a memory array (not shown) directly, in which case I/O corresponds to a bit line, and I/O bar corresponds to the corresponding complementary bit line in the memory array. Alternatively, I/O and I/O bar may connect to the memory array indirectly, one example being through a bus. Either way, I/O and I/O bar are complements of each other.

During one read cycle of the memory array, an equilibrating signal (EQ) is activated, or driven low on signal line 22. As known in the art, equilibrating signal (E Q) may be a separate equilibrating signal from the one utilized to equilibrate the memory array. Clocking circuit 10 then generates a first clocking signal (SCLK$_1$), which enables first sense amplifier 12 to read the data on I/O and I/O bar. An output state is provided to latch 16 based upon the data read by first sense amplifier 12.

At the same time the first clocking signal is input into first sense amplifier 12, first sense amplifier 12 is isolated from I/O and I/O bar as the result of an isolating signal (ISO$_1$) on signal line 24. After a predetermined time period, clocking circuit 10 generates a second clocking signal (SCLK$_2$), which enables second sense amplifier 14 to read the data on I/O and I/O bar. Second sense amplifier 4 can be isolated from I/O and I/O bar by an isolating signal (ISO$_2$) on signal line 26 during the second clocking.

Based upon the data read by second sense amplifier 14, the state of latch 16 may or may not change. If the data read by second sense amplifier 14 is different from the data read by first sense amplifier 12, the state of the latch changes to reflect the data read by second sense amplifier 14. If the data is the same as that read by first sense amplifier 12, the state of latch 16 remains unchanged.

Figure 2:
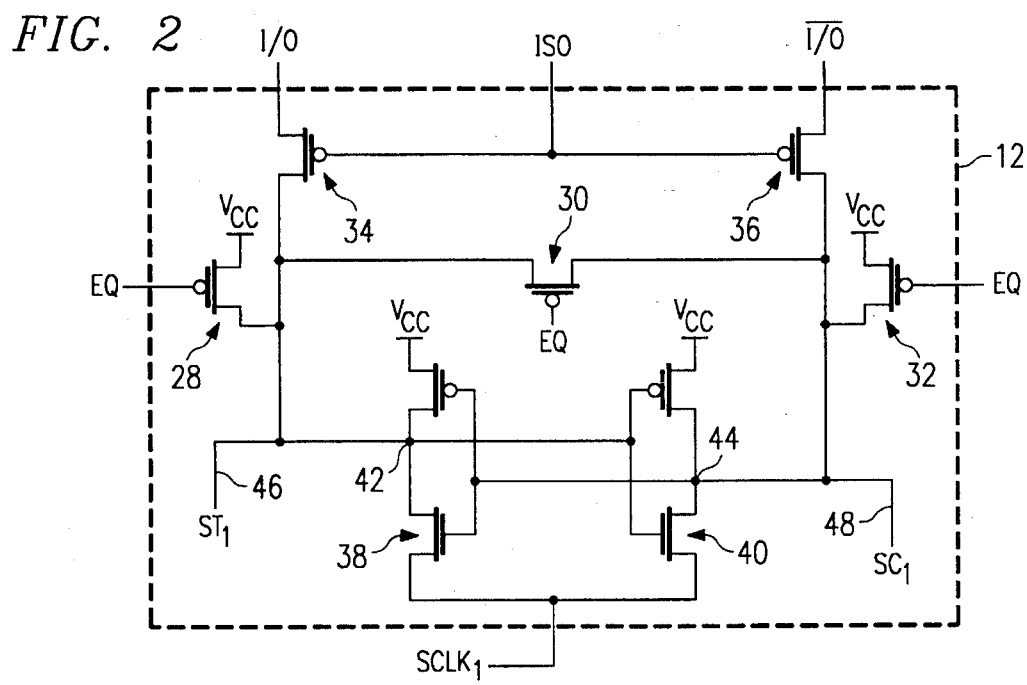
FIG. 2 depicts a detailed circuit diagram of one of the dynamic sense amplifiers in FIG. 1.

FIG. 2 depicts a detailed circuit diagram of one of the dynamic sense amplifiers in FIG. 1. As an example, let FIG. 2 illustrate first sense amplifier 12. Equilibrating signal (EQ) is an input into p-channel transistors 28, 30, 32. I/O and first isolating (ISO$_1$) signal are connected to p-channel transistor 34, with I/O bar and ISO$_1$ connected to p-channel transistor 36. Finally, first clocking signal (SCLK$_1$) is connected to transistors 38, 40.

To equilibrate first sense amplifier 12, EQ signal is set low to turn on transistors 28, 30, 32. This sets nodes 42, 44 to a common voltage level, which in the preferred embodiment is Vcc. Although the preferred embodiment utilizes transistors 28, 30, 32 to equilibrate sense amplifier 12, this step can also be performed with transistor 30 alone, or with transistors 28, 32. Transistor 30 may be used by itself since it shorts the input and complementary input lines together, which causes nodes 42, 44 to be set to a common voltage. Transistors 28, 32 may be used together to equilibrate the sense amplifier because they short the input and complementary input lines to the voltage level connected to transistors 28, 34. In the preferred embodiment, the voltage level is $V_{cc}$.

Referring again to FIG. 2, EQ signal then goes high to turn off transistors 28, 30, 32. To read the data on I/O and I/O bar, first isolating signal (ISO$_1$) is set low, which turns on transistors 34, 36, and the voltage level at either node 42 or 44 begins to drop as the corresponding I/O line discharges. Nodes 42, 44 begin to charge up or down to a voltage level which reflects the voltage level on I/O and I/O bar, respectively.

When the first clocking signal (SCLK$_1$) is set low to enable first sense amplifier 12 to read the data on I/O and I/O bar, ISO$_1$ is set high. Setting ISO$_1$ high turns off transistors 34, 36, to isolate the circuit from I/O and I/O bar. As known in the art, I/O and I/O bar have very high capacitance. Thus, isolating sense amplifier 12 from I/O and I/O bar enables sense amplifier 12 to read the data on I/O and I/O bar faster, since the high capacitive load of I/O and I/O bar has been removed. Isolating the sense amplifier from I/O and I/O bar also protects the signal on I/O and I/O bar from being disrupted when the sense amplifier is clocked. Finally, signal lines 46, 48 labeled ST$_1$ and SC$_1$, respectively, are connected to a latch, and the state of the latch depends upon the data read from I/O and I/O bar. Second sense amplifier 14 is configured like first sense amplifier 12, and operates in a similar manner.

Figure 3:
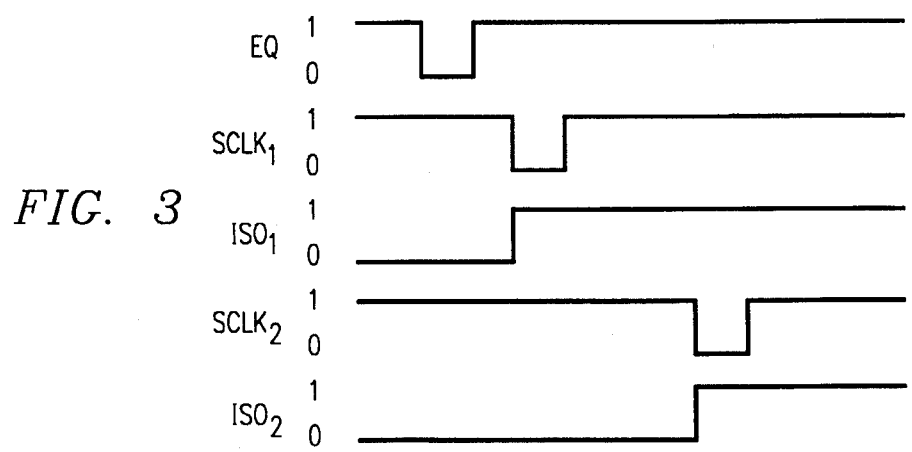
FIG. 3 illustrates a timing diagram for the circuit of FIG. 1.

Referring to FIG. 3, a timing diagram for the circuit of FIG. 1 is illustrated. Initially, the voltage levels of the equilibrating signal (EQ) and the first and second clocking signals (SCLK$_1$ and SCLK$_2$) are set high, while the first and second isolating signals (ISO$_1$ and ISO$_2$) are set low. Next, first and second sense amplifiers are equilibrated, which is depicted by the EQ signal going low for a period of time. SCLK$_1$ is then clocked low for a period of time while ISO$_1$ goes high, which allows first sense amplifier to read the data on I/O and I/O bar. After a period of time, SCLK$_2$ is clocked low for a period of time while ISO$_2$ goes high, which allows the second sense amplifier to read the data on I/O and I/O bar. In the preferred embodiment, ISO$_1$ and ISO$_2$ transition closely with SCLK$_1$ and SCLK$_2$ in order to avoid disrupting the signals on I/O and I/O bar.

Figure 4:
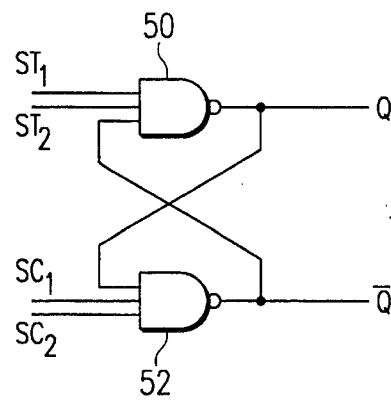
FIG. 4 depicts a circuit diagram of a latch which may be utilized with the present invention.

FIG. 4 depicts a circuit diagram of a latch which may be utilized with the present invention. Three-input NAND gates 50, 52 are cross-coupled, with ST$_1$ and ST$_2$ as inputs into NAND gate 50, and SC$_1$ and SC$_2$ as inputs into NAND gate 52. Initially, when sense amplifiers 12, 14 are equilibrated, ST$_1$, ST$_2$, SC$_1$, and SC$_2$ are all set high. The state of the latch is unaffected when ST$_1$, ST$_2$, SC$_1$, and SC$_2$ are all set high. After first sense amplifier 12 reads the data on I/O and I/O bar, the voltage level on either ST$_1$ or SC$_1$ will go low. For example, if ST$_1$ is high, or 1, and SC$_1$ is low, or 0, then Q=0 and Q bar=1. Alternatively, if ST$_1$ is 0 and SC$_1$ is 1, then Q=1 and Q bar=0.

If the latch depicted in FIG. 4 is used, it is necessary to recover first sense amplifier 12 before second sense amplifier 14 has control of latch 16. This is due to a potential contention problem within latch 16. The contention problem arises when first sense amplifier 12 incorrectly reads the data on I/O and I/O bar, and the output state of the latch will be changed after second sense amplifier correctly reads the data on I/O and I/O bar. For example, assume ST$_1$ is 1 and SC$_1$ is 0 after first sense amplifier 12 has incorrectly read the data on I/O and I/O bar. After second sense amplifier 14 correctly reads the data, ST$_2$ will be a 0 and SC$_2$ will be a 1. In this case, both Q and Q bar will be 1, an inaccurate output state.

Recovering first sense amplifier 12 can be accomplished several ways. One method involves setting SCLK$_1$ high, bringing ST$_1$ and SC$_1$ to a logic high voltage level. Alternatively, EQ may be set low to equilibrate first sense amplifier 12. This alternative, however, requires sense amplifier 12 and sense amplifier 14 to have separate equilibrating signal lines. After sense amplifier 12 is recovered, second sense amplifier 14 can provide an output state to latch 16.

Figure 5:
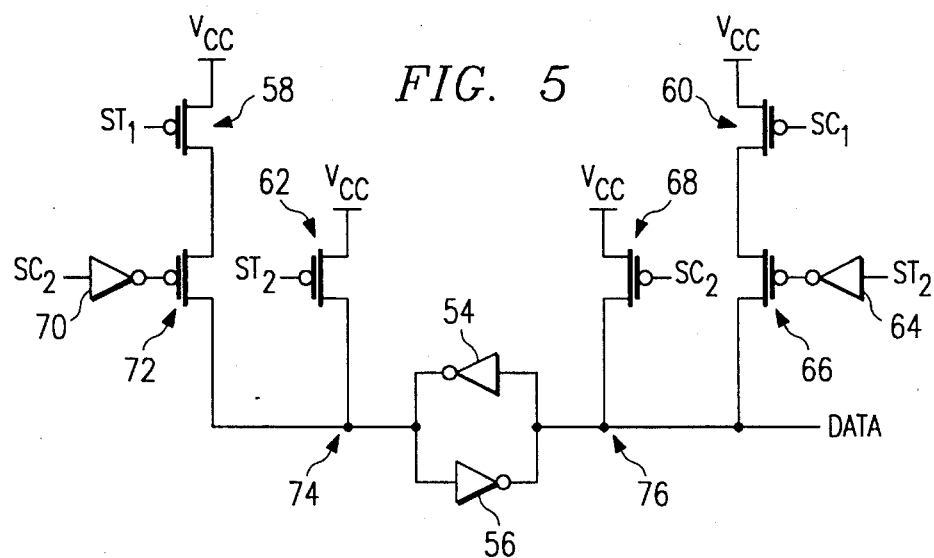
FIG. 5 illustrates a circuit diagram of an alternative latch which may be utilized with the present invention.

FIG. 5 illustrates a circuit diagram of an alternative latch which may be utilized with the present invention. Inverters 54, 56 are connected together, with ST$_1$ connected to p-channel transistor 58 and SC$_1$ connected to p-channel transistor 60. ST$_2$ is connected to p-channel transistor 62 and inverter 64. The output of inverter 64 connects to p-channel transistor 66. SC$_2$ is connected to p-channel transistor 68 and inverter 70. The output of inverter 70 connects to p-channel transistor 72. This latch configuration allows the output from second sense amplifier 14 to have priority over the output from first sense amplifier 12, thereby eliminating the need to recover first sense amplifier 12 before second sense amplifier 14 controls the latch.

For example, assume ST$_1$ is 1 and SC$_1$ is 0 after first sense amplifier 12 has incorrectly read the data on I/O and I/O bar. Transistor 60 is on, and transistor 58 is off. Since ST$_1$, ST$_2$, SC$_1$, and SC$_2$ were initially set to 1, ST$_2$ and SC$_2$ are 1. Therefore, transistors 62, 68 are off, and transistors 66, 72 are on. This allows the voltage levels at nodes 74, 76 to be 0 and 1, respectively.

After second sense amplifier 14 correctly reads the data, ST$_2$ will be a 0 and SC$_2$ will be a 1. Inverter 64 inverts the signal, causing transistor 66 to turn off. This cuts node 76 off from transistor 60, allowing the voltage level at node 76 to transition to 0 because transistors 66, 68 are both off. Transistor 72 is on, but transistor 58 is off so node 74 switches to a 1 because transistor 62 turns on. In summary, the clocking of second sense amplifier 14 disables the effect of first sense amplifier 12 on latch 16.

An alternative method for implementing the technique of disabling the effect of first sense amplifier 12 on latch 16 involves removing inverters 64, 70 and having ISO$_2$ connected to the gates of transistors 66, 72. This method operates in the same manner as described above, while eliminating the need for inverters 64, 70.

Figure 6:
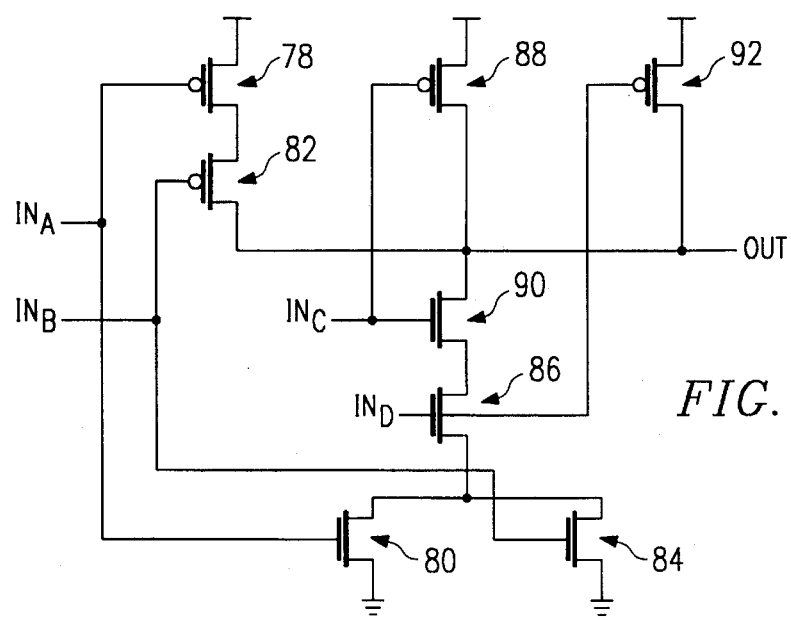
FIG. 6 depicts a circuit diagram of a portion of an alternative latch which may be utilized with the present invention.

Referring to FIG. 6, a circuit diagram of a portion of an alternative latch is depicted which may be utilized with the present invention. $IN_A$ is connected to the gates of p-channel transistor 78 and n-channel transistor 80. $IN_B$ is connected to the gates of p-channel transistor 82 and n-channel transistor 84. $IN_c$ is connected to the gates of p-channel transistor 88 and n-channel transistor 90. Lastly, $IN_D$ is connected to the gates of p-channel transistor 92 and n-channel transistor 86.

In the preferred embodiment, two circuits similar to the circuit illustrated in FIG. 6 are used to make one latch, where the latch also disables the effect of first sense amplifier 12 on latch 16. The output of second sense amplifier 14 has priority over the output from first sense amplifier 12. In one circuit of the latch, $IN_A$ is connected to $ST_1$, $IN_B$ is connected to $ISO_2$ or an inverted $SC_2$, $IN_c$ is connected to $ST_2$, and $IN_D$ is connected to the output of the second circuit of the latch. In the second circuit of the latch, $IN_A$ is connected to $SC_1$, $IN_B$ is connected to $ISO_2$ or an inverted $ST_2$, $IN_c$ is connected to $SC_2$, and $IN_D$ is connected to the output of the first circuit of the latch. A latch constructed in this manner may operate faster and use less current during switching than the latch illustrated in FIG. 5, because the pull up transistors do not have to overcome the effect of the inverters 54, 56. And unlike the latch in FIG. 4, sense amplifier 12 does not have to be recovered before sense amplifier 14 controls the latch.

One of the benefits of using dynamic sense amplifiers to read memory arrays is that dynamic sense amplifiers require much less current to operate in comparison to static sense amplifiers. One advantage of the present invention is the ability to recover the output of the dynamic sense amplifier by using a dual dynamic sense amplifier configuration. Another advantage is faster clocking rate for some memory arrays. The first sense amplifier may be clocked at an aggressive clocking speed, and a portion of the distribution of the memory arrays will correctly sense data at this rate. The second sense amplifier may be clocked at a slower clocking speed, thereby ensuring the remaining memory arrays in the distribution will be fully functional.

While the invention has been particularly shown and described with reference to a preferred embodiment, it will be understood by those skilled in the art that various changes in form and detail may be made therein without departing from the spirit and scope of the invention.

What is claimed is:

1. A data sensing circuit for use with a memory array, comprising:
   a latch for holding an output state;
   a first CMOS dynamic sense amplifier connected to an input line and a complementary input line, and having an output connected to the latch for writing an output state thereto;
   a second CMOS dynamic sense amplifier connected to the input line and complementary input line, and having an output connected to the latch for writing an output state thereto; and
   a clocking circuit connected to the first and second sense amplifiers, wherein the clocking circuit generates a first clocking signal which enables the first sense amplifier to sense data on the input line and complementary input line and write the sensed data to the latch through the first sense amplifier output, and wherein the clocking circuit generates a second clocking signal, after a predetermined period after the first clocking signal, which enables the second sense amplifier to sense data on the input line and complementary input line and write the sensed data to the latch through the second sense amplifier output, and wherein the first and second clocking signals are generated during one read cycle of the memory array.

2. The circuit of claim 1, wherein the first sense amplifier is recovered before the second sense amplifier provides an output to the latch.

3. The circuit of claim 1, wherein the first and second sense amplifiers are equilibrated before the first and second clock signals are generated in preparation for a single read cycle of the memory array.

4. The circuit of claim 1, wherein the first sense amplifier is isolated from the input and complementary input line when reading the data on the input and complementary input line.

5. The circuit of claim 1, wherein the second sense amplifier is isolated from the input and complementary input line when reading the data on the input and complementary input line.

6. The circuit of claim 1, wherein the input line is a bit line in the memory array, and the complementary input line is a complementary bit line in the memory array.

7. The circuit of claim 1, wherein the latch disables the first sense amplifier output when the second sense amplifier writes an output state to the latch.

8. A method for reading data from a memory array, comprising the steps of:
   applying an equilibrating signal to a first and a second CMOS dynamic sense amplifier in preparation for a single read cycle of the memory array, wherein the first and second sense amplifiers are connected to an input line and a complementary input line;
   applying a first clocking signal to the first sense amplifier to enable the first sense amplifier to read the data on the input and complementary input lines;
   isolating the first sense amplifier from the input and complementary input lines when applying the first clocking signal;
   reading the data on the input and complementary input lines;
   providing a state to a latch connected to the first and second sense amplifiers as a result of the first sense amplifier reading the data on the input and complementary input lines;
   after the first clocking signal is applied, applying a second clocking signal to the second sense amplifier to enable the second sense amplifier to read the data on the input and complementary input lines;
   reading the data on the input and complementary input lines; and
   providing an output state to the latch as a result of the second sense amplifier reading the data on the input and complementary input lines.

9. The method of claim 8, further comprising the step of isolating the second sense amplifier from the input and complimentary input lines when applying the second clocking signal.

10. The method of claim 8, wherein the latch is constructed so that the output state of the second sense amplifier has priority over the output state of the first sense amplifier.

11. The method of claim 8, wherein the latch is constructed utilizing a second isolating signal as an input, and wherein the output state of the second sense amplifier has priority over the output state of the first sense amplifier.

12. The method of claim 8, further comprising the step of recovering the first sense amplifier before the second sense amplifier provides the state to the latch.

13. The method of claim 8, wherein said step of applying the second clock signal to the second sense amplifier occurs after a predetermined time period from the step of applying the first clocking signal to the first sense amplifier.

14. The method of claim 8, further comprising the step of:
ceasing to apply the first clocking signal to the first sense amplifier before the second clock signal is applied to the second sense amplifier.

15. The method of claim 14, wherein the first and second clock signal are pulses, and wherein the first clock signal pulse is completed before the second clock signal pulse is applied.

* * * * *